US008960266B2

United States Patent
Yamamoto et al.

(10) Patent No.: US 8,960,266 B2
(45) Date of Patent: Feb. 24, 2015

(54) SEMICONDUCTOR WAFER TRANSPORT METHOD AND SEMICONDUCTOR WAFER TRANSPORT APPARATUS

(75) Inventors: Masayuki Yamamoto, Ibaraki (JP); Yukitoshi Hase, Kameyama (JP)

(73) Assignee: Nitto Denko Corporation, Osaka (JP)

( * ) Notice: Subject to any disclaimer, the term of this patent is extended or adjusted under 35 U.S.C. 154(b) by 367 days.

(21) Appl. No.: 13/304,135

(22) Filed: Nov. 23, 2011

(65) Prior Publication Data

US 2012/0132412 A1 May 31, 2012

(30) Foreign Application Priority Data

Nov. 30, 2010 (JP) ................................. 2010-266709

(51) Int. Cl.
*F24H 3/00* (2006.01)
*H01L 21/677* (2006.01)
*H01L 21/67* (2006.01)

(52) U.S. Cl.
CPC ...... *H01L 21/6776* (2013.01); *H01L 21/67109* (2013.01); *H01L 21/67132* (2013.01); *H01L 21/67784* (2013.01)
USPC ........................................... 165/47; 165/287

(58) Field of Classification Search
CPC ..................... H01L 21/6776; H01L 21/67109; H01L 21/67784; H01L 21/67132
USPC ..................... 165/47, 80.3, 185, 287
See application file for complete search history.

(56) References Cited

U.S. PATENT DOCUMENTS

| 5,898,727 | A  | * | 4/1999  | Fujikawa et al. | 373/110  |
|-----------|----|---|---------|-----------------|----------|
| 6,288,376 | B1 | * | 9/2001  | Tsumura         | 219/635  |
| 6,341,903 | B1 |   | 1/2002  | Ueda            |          |
| 6,723,651 | B2 | * | 4/2004  | Arita et al.    | 438/706  |
| 7,393,757 | B2 |   | 7/2008  | Miyamoto et al. |          |
| 2001/0009255 | A1 |   | 7/2001 | Savas         |          |
| 2002/0011655 | A1 |   | 1/2002 | Nishiyama et al. |       |
| 2002/0178883 | A1 | * | 12/2002 | Yamamoto     | 83/22    |
| 2004/0226936 | A1 | * | 11/2004 | Oyama et al. | 219/444.1 |
| 2005/0042881 | A1 | * | 2/2005  | Nishimoto et al. | 438/710 |
| 2005/0275746 | A1 | * | 12/2005 | Nishida et al. | 348/360 |
| 2005/0280681 | A1 | * | 12/2005 | Kim et al.   | 347/102  |

(Continued)

FOREIGN PATENT DOCUMENTS

EP 0 462 563 A1 12/1991
JP 62-132328 A 6/1987

(Continued)

OTHER PUBLICATIONS

Singapore Search Report and Examiner's Written Opinion for the Application. No. 201108631-1 mailed Jan. 11, 2013.

(Continued)

*Primary Examiner* — Mohammad M Ali
(74) *Attorney, Agent, or Firm* — Cheng Law Group, PLLC

(57) ABSTRACT

A semiconductor wafer joined to a carrier via a double-faced adhesive tape having an adhesive layer of a heating separation property is heated for removal from the carrier. The double-faced adhesive tape is separated from the semiconductor wafer on a holding table. Thereafter, an air nozzle preliminarily cools the semiconductor wafer for a given time during transportation with a wafer transport section. Upon completion of the preliminary cooling, the semiconductor wafer is placed on a cooling stage to cool it to a target temperature.

8 Claims, 15 Drawing Sheets

(56) References Cited

U.S. PATENT DOCUMENTS

| | | | |
|---|---|---|---|
| 2006/0191271 A1* | 8/2006 | Takahashi et al. | 62/3.7 |
| 2007/0209593 A1* | 9/2007 | Aggarwal et al. | 118/724 |
| 2008/0013946 A1* | 1/2008 | Ono et al. | 396/578 |
| 2010/0002355 A1* | 1/2010 | Morooka | 361/234 |
| 2010/0038833 A1* | 2/2010 | Kasai et al. | 266/250 |
| 2010/0055347 A1 | 3/2010 | Kato et al. | |
| 2010/0211216 A1 | 8/2010 | Morita | |

FOREIGN PATENT DOCUMENTS

| | | |
|---|---|---|
| JP | EP 0462563 A1 * | 12/1991 |
| JP | 9-148238 A | 6/1997 |
| JP | 2001-308116 A | 11/2001 |
| JP | 2005-116679 A | 4/2005 |
| JP | 2007-200994 A | 8/2007 |
| JP | 2009-290207 A | 12/2009 |
| TW | 201029089 A1 | 8/2010 |
| TW | 201041072 A1 | 11/2010 |
| WO | WO-2009/026765 A1 | 3/2009 |

OTHER PUBLICATIONS

Taiwanese Notification for the Opinion of Examination for the Application No. 100143467 mailed Jul. 30, 2014.

European Search Report for Application No. EP 11 00 9376 dated Aug. 5, 2014.

\* cited by examiner

SEMICONDUCTOR WAFER TRANSPORT METHOD AND SEMICONDUCTOR WAFER TRANSPORT APPARATUS

BACKGROUND OF THE INVENTION (1) Field of the Invention

This invention relates to a semiconductor wafer transport method and semiconductor wafer transport apparatus for transporting a semiconductor wafer. More particularly, this invention is directed to a technique of transporting a heated semiconductor wafer.

(2) Description of the Related Art

In recent years, a semiconductor wafer (hereinafter, appropriately referred to as a "wafer") tends to be ground to have a thickness of several tens micrometers with a need for a high-density package. Accordingly, a circuit and a bump formed on a surface of the wafer may be damaged from a back grinding process until a dicing process, which leads to reduced manufacturing efficiency.

A dicing process is performed to the wafer having a circuit already formed thereon prior to a back grinding process, whereby only non-defective bear chips are sorted. The bear chips are fixedly arranged in a two-dimensional array on an adhesion sheet joined to a carrier substrate. Here, an electrode surface of the bear chip is directed downward. Then, the bear chips are covered with a resin for renewal of the wafer in a wafer shape (hereinafter, referred to as a "renewed wafer"), and the substrate is separated from the renewed wafer. Thereafter, back grinding is performed to the wafer on an opposite side of the electrode surface. The thinned renewed wafer is adhesively held on a ring frame via a support adhesive tape, and transported to a dicing process where the bear chips are diced from the resin. See Japanese Patent Publication No. 2001-308116.

Reinforcement of the wafer includes another aspect as under. That is, for providing rigidity to the wafer thinned through back grinding, a support member for reinforcement having a larger diameter than the wafer is joined to the wafer via a double-faced adhesive tape. An adhesive is adopted in the double-faced adhesive tape having a heat separation property that reduces or eliminates adhesion due to foaming and expansion from heating. See Japanese Patent Publication No. 2005-116679.

As above, the wafer from which the substrate or the support member is separated is cooled on a holding table where the wafer is to be transported.

In addition to the above aspect of the wafer, the renewed wafer and the substrate are joined together via a double-faced adhesive tape having a heat separation property. In this case, when the renewed wafer is separated from the substrate, resin expands due to heating. In other words, the resin has expansion coefficient higher than the bear chip. Moreover, since the resin has higher expansion coefficient than the bear chip, the resin naturally has higher shrinkage due to cooling than the bear chip.

Consequently, the renewed wafer placed on the holding table under a cooling state is cooled rapidly in a short time, and the renewed wafer may be warped due to difference of shrinkage between the bear chip and the resin associated with temperature changes. Alternatively, cracks may occur in the resin, which leads to reduced rigidity. As a result, there arises a problem that damages of the bear chip and handling errors for the renewed wafer may occur.

When the support member is separated with heating from the wafer subject to a back grinding process and the double-faced adhesive tape remains on the wafer, rapid cooling of the wafer in a short time may lead to largely warping of the wafer due to difference in shrinkage between the double-faced adhesive tape and the wafer associated with temperature changes. Accordingly, such warp may cause the wafer to be damaged.

Moreover, a temperature of the wafer gradually decreases to a given temperature with one holding table, processing is suspended prior to a cooling step, which results such disadvantage as reduced treatment efficiency. Alternatively, two or more holding tables may be provided. However, this may leads to an upsized apparatus configuration.

SUMMARY OF THE INVENTION

This invention has been made regarding the state of the art noted above, and its primary object is to provide a method and apparatus for transporting a semiconductor wafer that allows efficient cooling with no damage thereon.

This invention discloses a semiconductor wafer transport method for transporting a semiconductor wafer covered with a resin or an adhesive tape. The method includes preliminarily cooling of the semiconductor wafer under a heating state during transportation to a cooling stage.

According to this method, the semiconductor wafer under a heating state is preliminarily cooled during transportation on a transportation path. Consequently, the semiconductor wafer is gradually cooled until reaching to the cooling stage. This may avoid shrinkage of the resin or the adhesive tape having a higher thermal expansion coefficient than the semiconductor on the holding table due to rapid cooling in a short time. As a result, warp of the semiconductor wafer may be prevented that occurs due to difference in shrinkage between the resin or the adhesive tape and the semiconductor wafer. Moreover, damages in the semiconductor wafer due to the warp may also be prevented.

Moreover, time for lowering a temperature to a given value in the cooling stage is shortened through preliminarily cooling the semiconductor wafer. Accordingly, a processing time may be shortened that is necessary for transporting the semiconductor wafer subjected to desired processing out of each processing step.

Moreover, preliminary cooling may be conducted through blowing air from a nozzle provided above the semiconductor wafer that passes on the transportation path. Alternatively, preliminary cooling may be conducted through blowing air from the transportation path toward a rear face of the semiconductor wafer. Alternatively, preliminary cooling may be conducted through blowing air simultaneously from upper and lower sides of the semiconductor wafer.

Moreover, preliminary cooling is preferably controlled as under. That is, when the semiconductor wafer under a heating state at a given temperature is cooled to a target temperature, a correlation between a cooling temperature and shrinkage of the resin or the adhesive tape is determined in advance such that a warp amount of the semiconductor wafer falls within a given range. A detector detects a temperature and a transportation speed of the semiconductor wafer in the transport process, and at least any of a temperature and a flow rate of air supplied towards the semiconductor wafer and a transportation speed of the semiconductor wafer is controlled in accordance with detection results.

Preliminary cooling is controlled in such a manner, whereby the resin or the adhesive tape may gradually be shrunk for a given time such that the semiconductor wafer is warped within a given range. Accordingly, even when the semiconductor wafer differs from the resin or the adhesive tape in shrinkage, a warping amount of the semiconductor may be suppressed. That is because deviation in shrinkage per unit time decreases. Consequently, there may be suppressed damages and handling errors of the semiconductor wafer.

This invention also discloses semiconductor wafer transport apparatus for transporting a semiconductor wafer covered with a resin or an adhesive tape. The apparatus includes a wafer transport section, a preliminary cooling nozzle, a holding stage, and a cooler. The wafer transport section transports the semiconductor wafer under a heating state. The preliminary cooling nozzle blows air towards the semiconductor wafer transported with the wafer transport section. The holding stage mounts and holds the semiconductor wafer preliminarily cooled. The cooler cools the semiconductor wafer on the holding stage.

According to this configuration, the semiconductor wafer under a heating state is gradually cooled on the wafer transportation path with air until reaching the holding stage. Accordingly, the foregoing method may suitably be implemented.

Moreover, the wafer transport section in the foregoing configuration may includes a first blow-off section and a second blow-off section on a transport surface thereof, the first blow-off section at a center portion of the wafer transport section blows air vertically against a rear face of the semiconductor wafer along a transport direction of the semiconductor wafer, the second blow-off section blows air obliquely against the rear face of the semiconductor wafer in a semiconductor wafer width direction, in which the wafer transport section has a give clearance in the semiconductor wafer width direction for transporting while floating the semiconductor wafer on the transport surface larger than the semiconductor wafer, and controls travel of the semiconductor wafer through adjusting a flow rate of air supplied from the preliminary cooling nozzle, the first blow-off section, and the second blow-off section. Such configuration may be adopted.

According to this configuration, the semiconductor wafer may be preliminary cooled from upper and lower sides while being transported in a non-contact manner with the wafer transport section. Consequently, this configuration may eliminate difference in temperature between the surface and the rear face of the semiconductor wafer, which may suppress warp of the semiconductor wafer with reliability.

The foregoing configuration preferably includes two or more temperature sensors, a speed detector, a memory, and a controller. The two or more temperature sensors detect a temperature of the semiconductor wafer transported on the wafer transport section and a temperature of the semiconductor wafer on the holding table. The speed detector detects a transportation speed of the semiconductor wafer being transported with the wafer transport section. The memory memorizes a correlation between a cooling temperature and shrinkage of the resin or the adhesive tape such that a warp amount of the semiconductor wafer falls within a given range when the semiconductor wafer under a heating state at a given temperature is cooled to reach a target temperature. The controller controls a temperature of the semiconductor wafer through detecting the temperature and the transport speed of the semiconductor wafer transported with the wafer transport section by the temperature sensors and the speed detector, and selecting a condition for changing setting of at least any of a temperature and a flow rate of air supplied toward the semiconductor wafer and a transport speed of the semiconductor wafer in accordance with detection results.

This method may realize reduced shrinkage of the semiconductor wafer relative to the resin or the adhesive tape associated with variation in cooling temperatures as well as suppression of a warp amount of the semiconductor wafer with reliability.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DESCRIPTION OF THE PREFERRED EMBODIMENTS

One embodiment of this invention is now to be described below with reference to the drawings.

Figure 2:
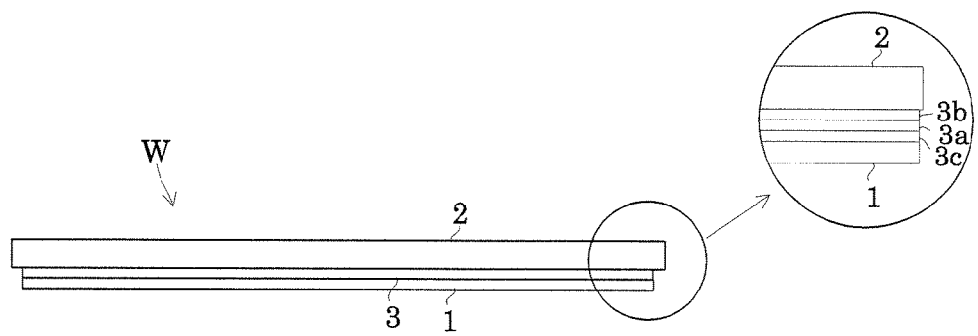
FIG. 2 is a side view of a workpiece having a carrier joined to a semiconductor wafer.

Semiconductor wafer transport apparatus of this invention is provided in a carrier removal device. As shown in FIG. 2, the carrier removal device removes a semiconductor wafer 1 (hereinafter, appropriately referred to as a "wafer") prior to back grinding from a carrier 2 formed of a stainless steel, a glass substrate, or a silicon substrate. The semiconductor wafer 1 is joined coaxially to the carrier 2 via a double-faced adhesive tape 3. Here, the carrier 2 has a shape approximately similar to the wafer 1, and has a diameter equal or larger than the wafer 1.

Figure 3:
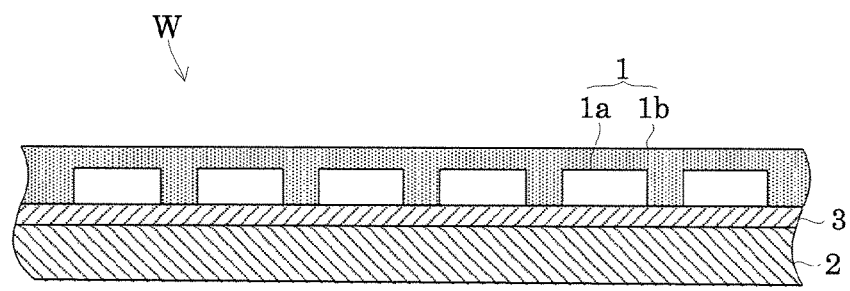
FIG. 3 is a sectional view of the semiconductor wafer.

Here, the wafer 1 is formed as follows. That is, bear chips 1a to which a dicing process is performed are inspected after circuit formation on a wafer surface for sorting out only non-defective bear chips 1a. The non-defective bear chips 1a are fixedly arranged in a two-dimensional array on the double-faced adhesive tape 3 joined to the carrier 2, as shown in FIG. 3, with electrode surfaces thereof being directed downward. Moreover, the bear chips 1a are covered with a resin 1b, which are renewed into a wafer shape.

Now, referring again to FIG. 2. The double-faced adhesive tape 3 includes a tape base material 3a having an adhesive layer 3b and an adhesive layer 3c on opposite surfaces thereof. The adhesive layer 3b with a heat separation property loses its adhesion due to foaming and expansion from heating. The adhesive layer 3c is ultraviolet curable type that reduces its adhesion due to curing by irradiation with ultraviolet rays, or a non-ultraviolet curable type and pressure-sensitive. That is, the carrier 2 is joined to the adhesive layer 3b of the double-faced adhesive tape 3, and the wafer 1 is joined to the adhesive layer 3c.

Figure 1:
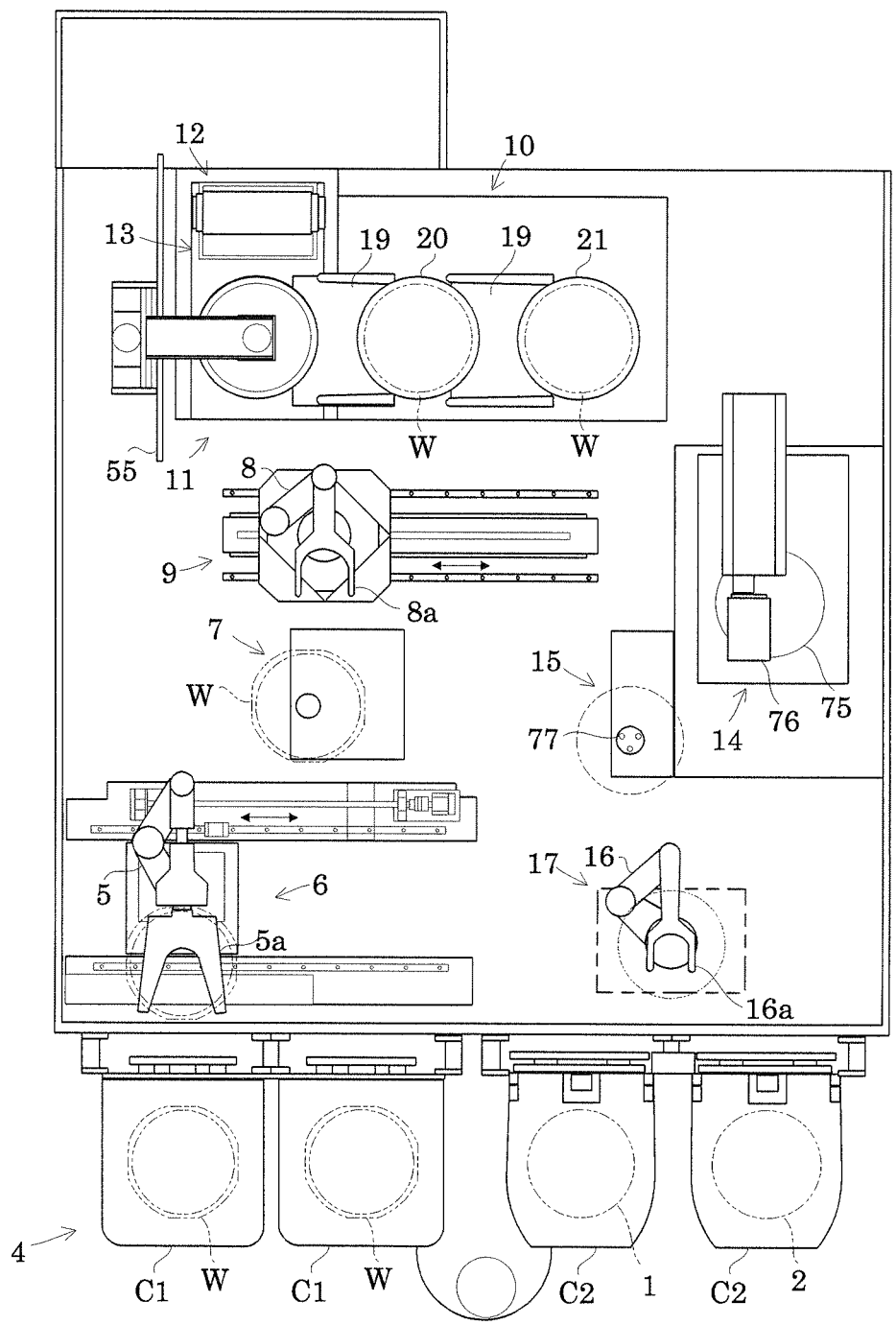
FIG. 1 is a plan view showing a whole configuration of apparatus according to one embodiment.
Figure 4:
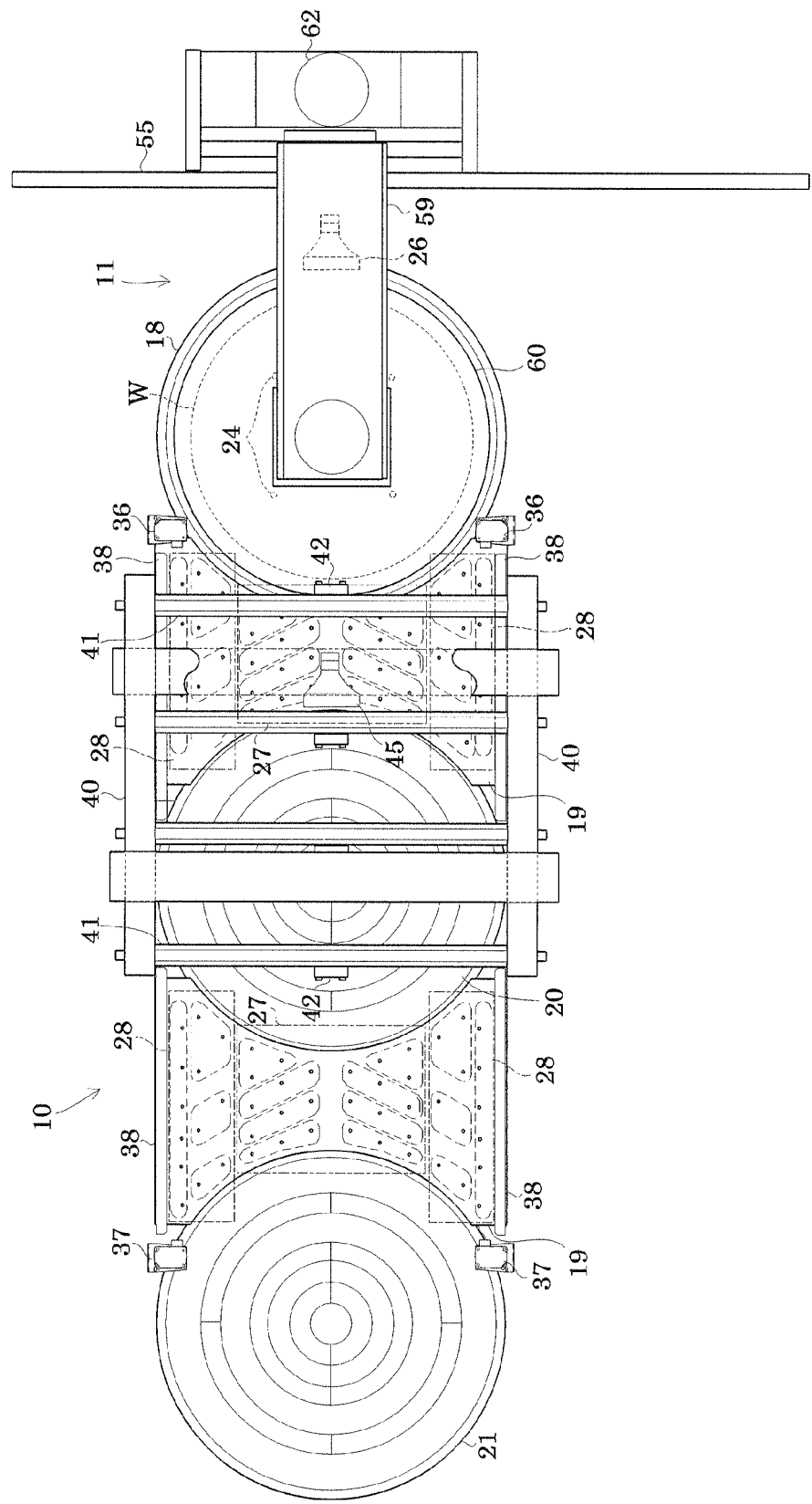
FIG. 4 is a plan view of wafer transport apparatus.
Figure 5:
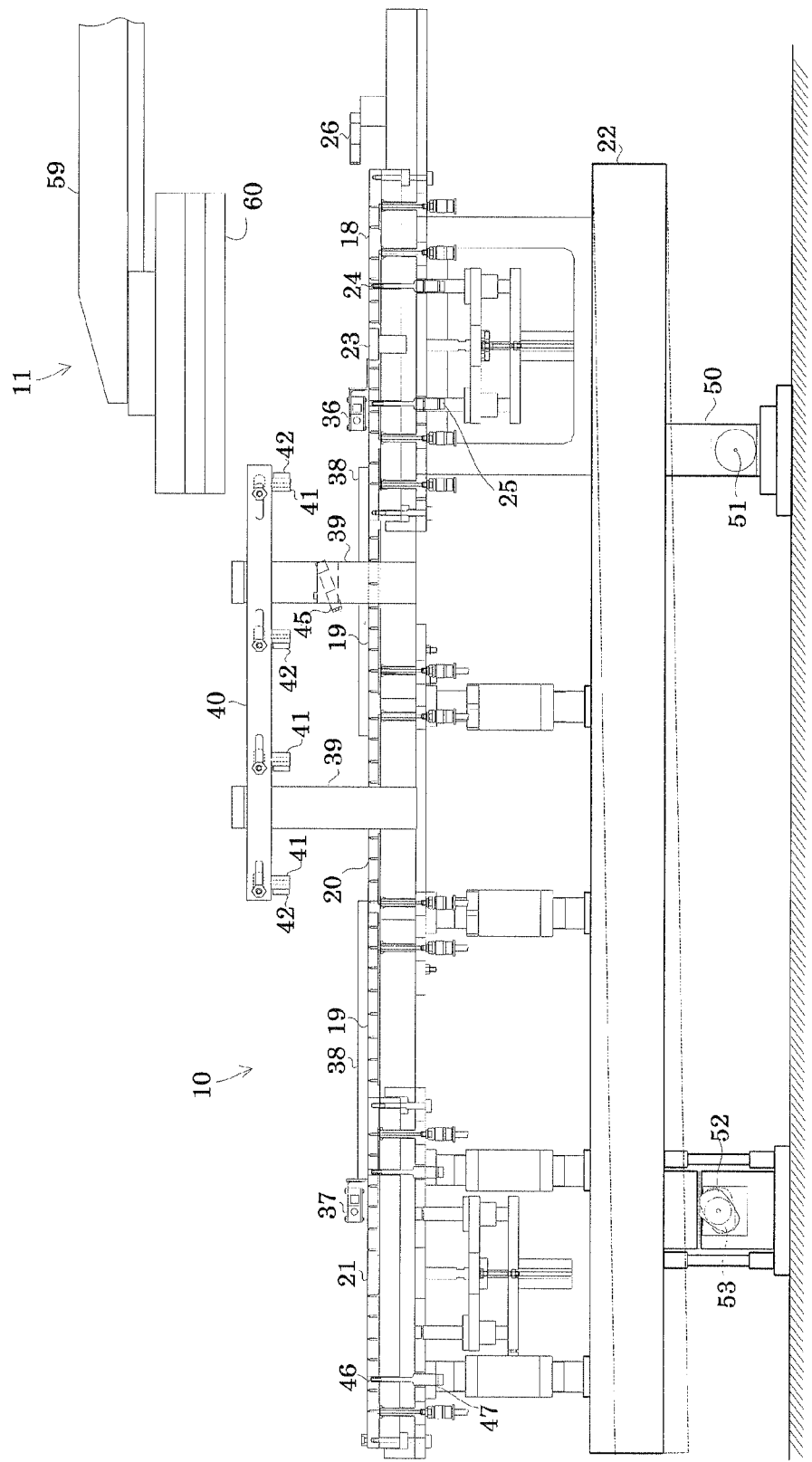
FIG. 5 is a side view of the wafer transport apparatus.

FIG. 1 is a plan view of carrier removal apparatus according to this invention. FIG. 4 is a plan view of wafer transport apparatus, and FIG. 5 is a front view thereof.

The carrier removal apparatus includes a wafer supply/collecting section 4, a first wafer transport mechanism 6, an alignment stage (aligner) 7, a second wafer transport mechanism 9, wafer transport apparatus 10, a carrier removal mechanism 11, a tape separation mechanism 12, a tape collecting section 13, a marking section 14, a wafer deliver section 15, and a third wafer transport mechanism 17. The wafer supply/collecting section 4 has cassettes C1 and cassettes C2 mounted thereon, the cassettes C1 housing workpieces W each formed of the wafer 1 and the substrate 2, the cassettes C2 housing the wafers 1 and the carriers 2, respectively. The first wafer transport mechanism 6 has a first robot arm 5. The second wafer transport mechanism 9 has a second robot arm 8. The carrier removal mechanism 11 removes the carrier 2 from the wafer 1. The tape separation mechanism 12 separates and removes the double-faced adhesive tape 3 from the wafer 1 from which the carrier 2 is removed. The tape collecting section 13 collects the separated and removed double-faced adhesive tapes 3. The marking section 14 marks the wafer 1. The third wafer transport mechanism 17 has a third robot arm 16. Next, each mechanism will be described in detail.

The wafer supply/collecting section 4 has two cassettes C1 on a supply side and two cassettes C2 on a collection side that are arranged in parallel. The cassette C1 houses horizontally in a stack manner the workpieces W with the wafer 1 and the carrier 2 joined together where the carrier 2 is directed downward. One cassette C2 houses wafers 1 horizontally in a stack manner from which the carrier 2 is each removed and each have a circuit surface of the bear chips 1a directed upward. The other cassette C2 houses removed carriers 2 horizontally in a stack manner.

The first robot arm 5 of the first wafer transport mechanism 6 is reversible, and movable horizontally. Further, the first robot arm 5 is turnable and movable vertically as a whole. The first robot arm 5 has a tip end provided with a U-shaped workpiece holder 5a of a vacuum suction type.

The alignment stage 4 performs alignment on the workpiece W that is transported and placed thereon by the first wafer transport mechanism 6, based on a notch or an orientation flat formed at an outer periphery of the workpiece W.

The second robot arm 8 of the wafer transport mechanism 9 is movable horizontally. Further, the robot arm 8 is turnable and movable vertically as a whole. The second robot arm 8 has a tip end provided with a U-shaped wafer holder 8a of a vacuum suction type.

As shown in FIGS. 4 and 5, the wafer transport apparatus 10 includes a holding table 18, a wafer transport section 19, a cooling stage 20, and a transportation stage 21 that are positioned on a swinging movable table 22. Here, the cooling stage 20 corresponds to a first holding stage in this invention. The transportation stage 21 corresponds to a second holding stage in this invention.

The holding table 18 is a metal chuck table. The holding table 18 is in communication with an external vacuum device via a channel. That is, the holding table 18 suction-holds the placed workpiece W. The holding table 18 is provided with a suction pad 23 and two or more support pins 24. The holding table 18 is moved upward and downward via a cylinder 85. Here, the holding table 18 is not limited to metal, but may be formed of a ceramic porous material.

The suction pad 23 is placed at a center portion of the holding table 18, and its top surface movable upward and downward is formed as a vacuum suction surface The support pins 24 are spaced at regular intervals on a given circumference of the holding table 18. Specifically, the support pins 24 are movable upward and downward from a holding surface of the holding table 18 via a cylinders 25. Moreover, the tip of the support pin 24 is formed of an insulator, or is covered with an insulator.

Figure 18:
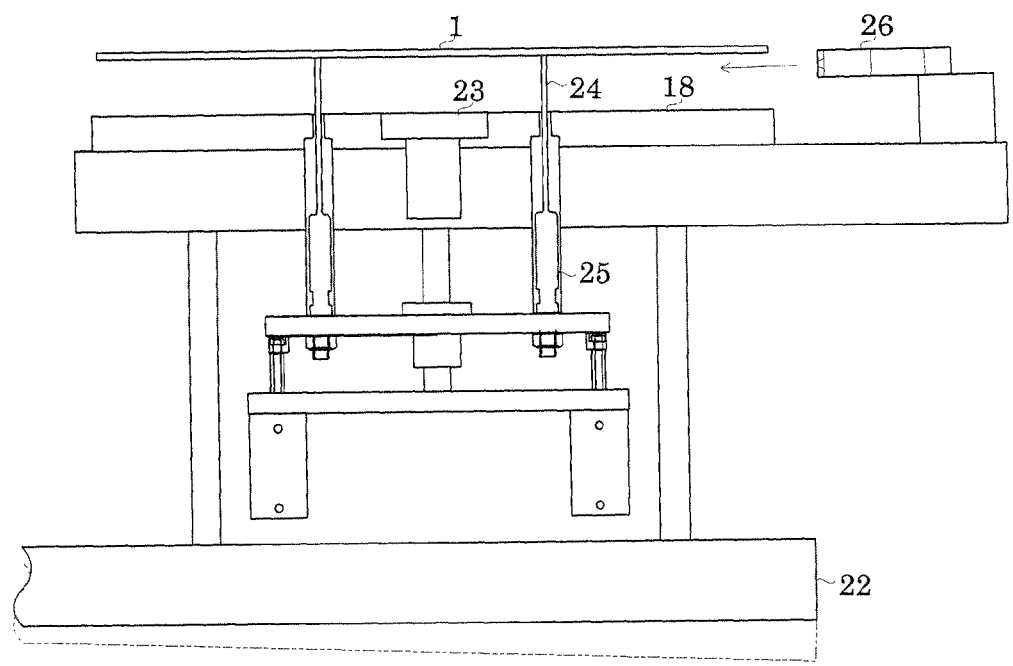
FIGS. 18 to 20 are explanatory views each showing operation of the wafer transport apparatus.

A nozzle 26 is arranged behind the holding table 18. As shown in FIG. 18, the nozzle 26 has a tip end directed obliquely downward as to blow air between the holding table 18 and the wafer 1 or the carrier 2 pushed up from the holding table 18 and held with the support pins 24.

Now referring again to FIG. 4. The wafer transport section 19 is in a plate shape having a width larger than the wafer 1 and the carrier 2 to be transported. The wafer transport section 19 is connected to the holding table 18 and the transportation stage 21 as to sandwich the cooling stage 20. The transport path 2 has a transport surface including a first blow-off section 27 and second blow-off sections 28. The first blow-off section 27 is shown in FIG. 4 by alternate long and short dash lines at a center portion of the transport path 2 along a transportation direction. The second blow-off sections 11 are shown in FIG. 4 by alternate long and short dash lines on opposite sides of the transport path 2 as to sandwich the first blow-off section 10.

Figure 7:
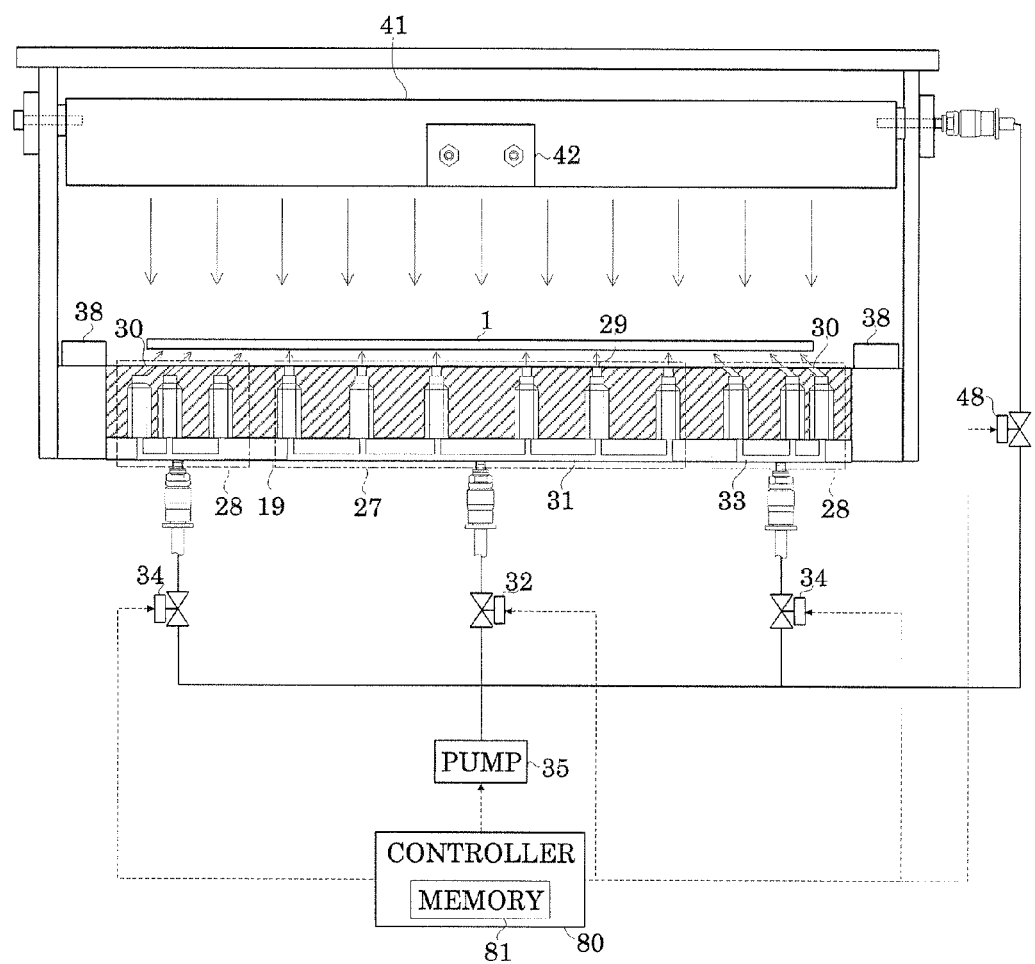
FIG. 7 is a sectional view of a wafer transportation path.

As shown in FIG. 7, the first blow-off section 27 includes two or more holes 29 formed vertically through the wafer transport section 19. The holes 29 are brought together by a channel 31 formed in a rear face of the wafer transport section 19, where the holes 29 are communicated. The channel 31 where the holes 29 are brought into one includes a first electromagnetic valve 32 on one end. The other end of the electromagnetic valve 32 is communicated with a pump 35.

The second blow-off section 28 has two or more holes 30 formed through the wafer transport section 19 obliquely toward a center thereof relative to a traveling direction of the wafer 1. The holes 30 are brought together by channels 33 communicated therewith for every second blow-off section 28 on a rear face side of both ends thereof. Each channel 33 where the holes 30 are brought into one includes a second electromagnetic valve 34 on one end. The other end of the electromagnetic valve 34 is communicated with the pump 35.

Now referring again to FIGS. 4 and 5. Two detectors each consisting of a light projector 36 and a light receiver 37 are positioned on opposite ends of the wafer transport section 19 in a width direction. The light projector 36 is on a transport start position side of the wafer transport section 19, the light receiver 37 on a transport termination position side. That is, each detector is spaced away by a given clearance from an outer periphery end of the wafer 1 or the carrier 2 that is transported along the center of the wafer transport section 19.

Moreover, guide walls 38 are each provided on opposite ends of the wafer transport section 19 for preventing the wafer 1 and the carrier 2 from dropping. The surface of the guide wall 38 is covered with an elastic body.

A strut 39 is erected on each side of the wafer transport section 19 and the cooling stage 20. The strut 39 includes a frame 40 that allows upward and downward movement. Two or more air nozzles 41 are arranged at a given clearance along a transportation direction of the wafer 1 across the frames 40 on both ends. Here, the air nozzle 41 corresponds to the preliminary cooling nozzle in this invention. The strut 39, the frame 40, and the air nozzle 41 constitutes the preliminary cooling device.

As shown in FIG. 7, the air nozzle 41 has openings in a width direction for blowing air against the wafer 1. Air is supplied from the pump 35 to the air nozzle 41 via the third electromagnetic valve 48. Moreover, a controller 80 controls opening/closing and a degree of opening of the third electromagnetic valve 48 for adjusting a flow rate of air.

Each nozzle 41 includes at a center portion thereof a temperature sensor 42 for detecting a temperature of the wafer 1 passing thereunder. A detection signal of the temperature sensor 42 is sent to the controller 80.

Figure 8:
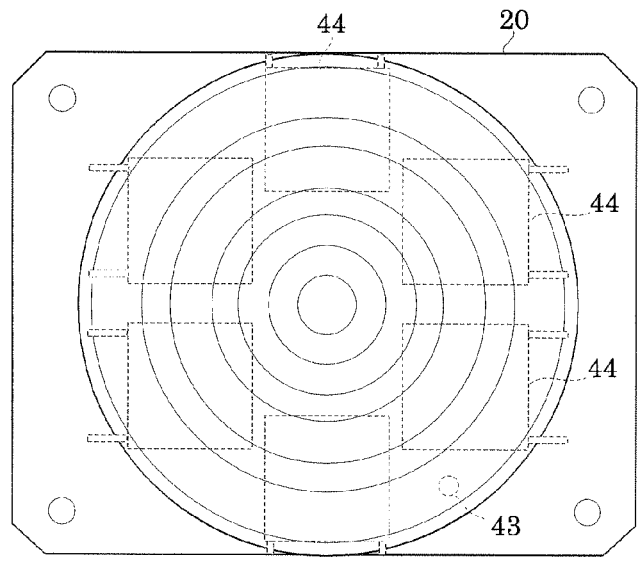
FIG. 8 is a plan view of a holding table.

As shown in FIG. 8, the cooling stage 20 includes a temperature sensor 43. Moreover, the cooling stage 20 includes inside thereof a Peltier device 44 for cooling the wafer 1 thereon. Here, the cooling stage 20 corresponds to the first cooling stage in this invention.

As shown in FIGS. 4 and 5, a nozzle 45 is provided on one strut 39 of the cooling stage 20. Here, a detection signal of the temperature sensor 43 is also sent to the controller 80.

As shown in FIG. 5, the nozzle 45 has a front end directed obliquely downward to blow air toward a back end of the wafer 1 or the carrier 2 on the cooling stage 20.

The transportation stage 21 is a metal chuck table, and is communicated with an external vacuum device via a channel. That is, the transportation stage 21 suction-holds the wafer 1 or the carrier 2 transported onto the holding table. Moreover, the transportation stage 21 is provided with support pins 46, similarly to the holding table 18. The transportation stage 21 is not limited to metal, but may be formed of a ceramic porous material. Here, the transportation stage 21 corresponds to the second cooling stage in this invention.

The support pins 46 are spaced away at given intervals on a given circumference of the transportation stage 21. The support pins 46 are movable upward/downward from the holding surface of the transportation stage 21 via cylinders 47. Moreover, a tip end of the support pin 46 is formed of an insulator, or is covered with an insulator.

The swinging movable table 22 is swingingly supported via a support shaft 51 in a strut 50 provided on a lower side of the holding table 18. Moreover, the swinging movable table 22 is supported via a lifting cam 52 on a lower side of the transportation stage 21. Specifically, the lifting cam 52 is driven backward and forward by a motor 53 connected thereto. Accordingly, the swinging movable table 22 is slightly inclined downward in the traveling direction of the wafer W or the carrier 2 while pivoting about the support shaft 51.

Figure 11:
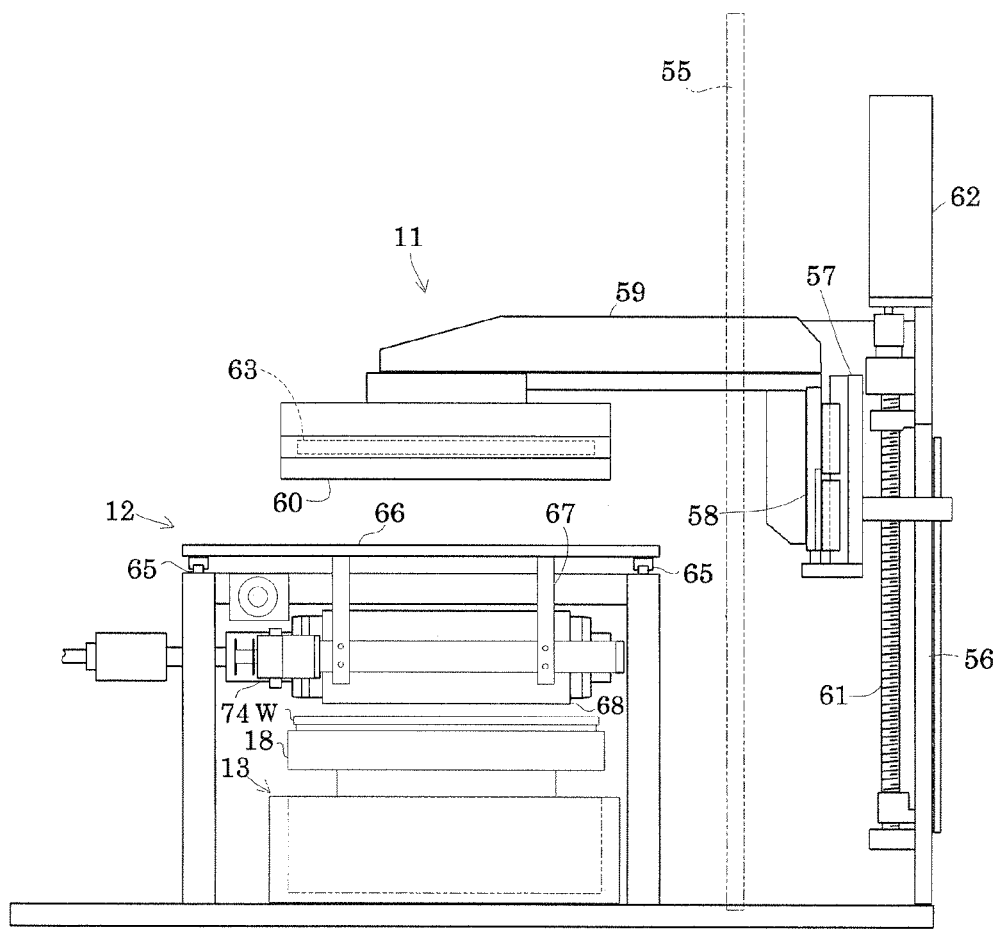
FIG. 11 is a side view showing a carrier removal mechanism.

As shown in FIG. 11, the carrier removal mechanism 11 has a movable table 57, a movable frame 58, and a suction plate 60. The movable table 57 moves upward and downward along a rail 56 arranged vertically at a backside of a wall 55. The movable frame 58 is supported on the movable table 57 so as to control a level thereof. The suction plate 60 is provided at a tip end of an arm 59 that extends forward from the movable frame 58.

The movable table 57 moves upward and downward in a screw feed manner by backward and forward rotation of a screw shaft 61 by a motor 62. The suction plate 60 has an undersurface formed as a vacuum suction surface, and a heater 63 embedded therein.

Figure 9:
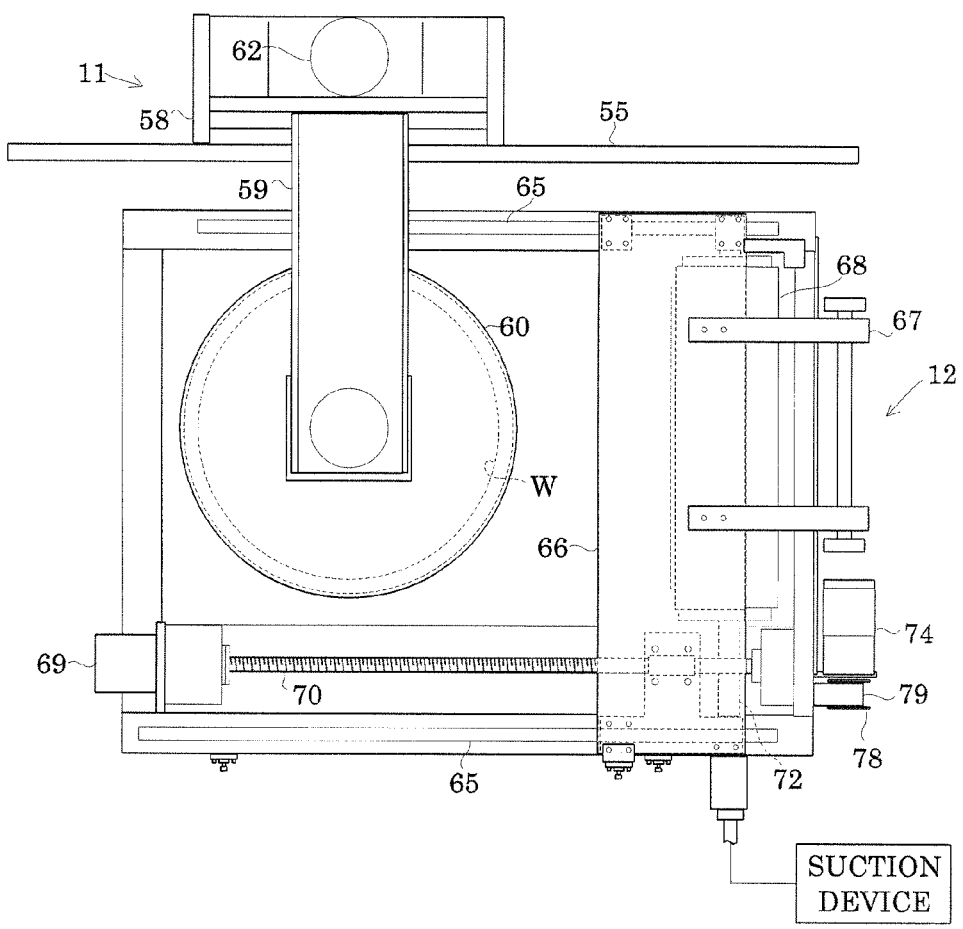
FIG. 9 is a plan view showing the surrounding of the holding table.
Figure 10:
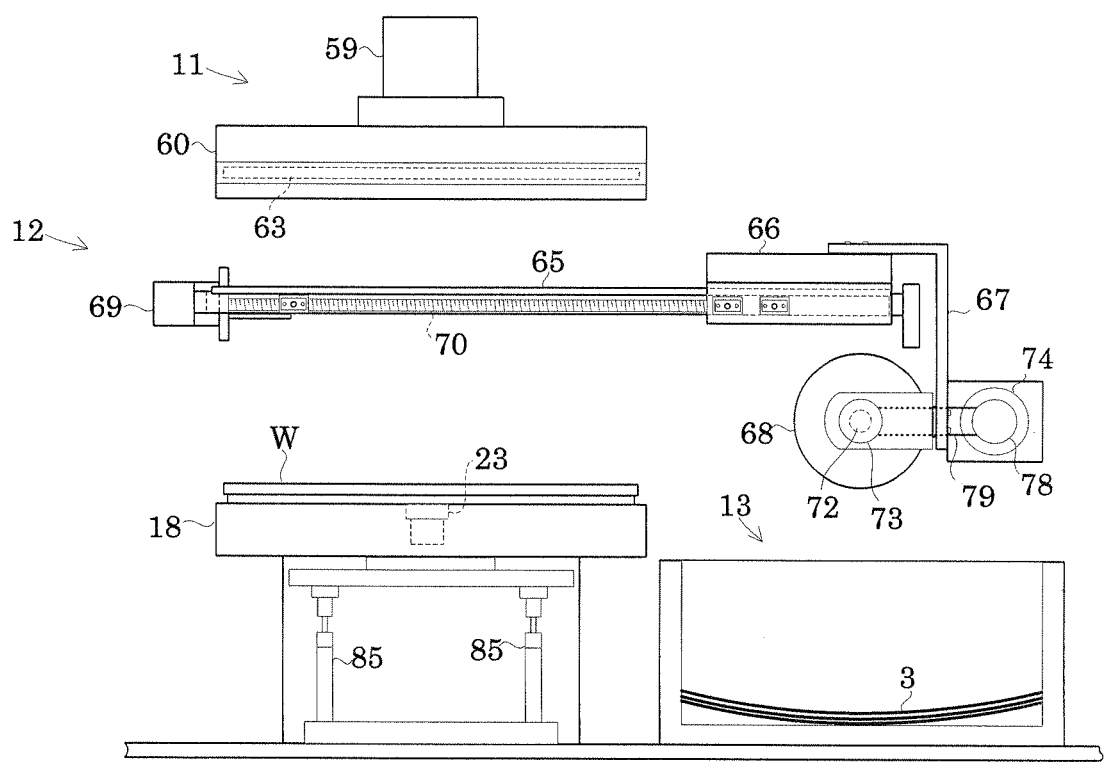
FIG. 10 is a front view showing the surrounding of the holding table.

As shown in FIGS. 9 to 11, the tape separation mechanism 12 is provided with a separation roller 68 via support frames 67 projecting downward from a movable table 66 that allows sliding movement in a backward/forward direction along a rail 65.

The movable table 66 independently moves in a screw feed manner through a screw shaft 70 that rotates backward/forward with a motor 69.

Figure 12:
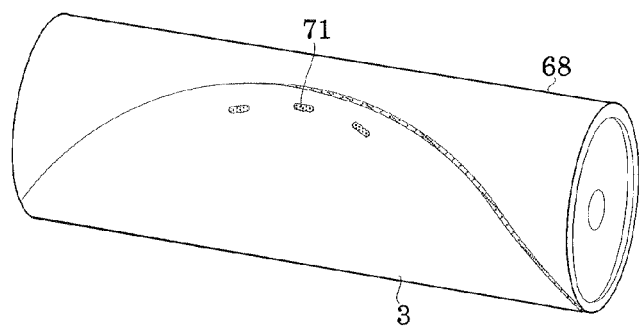
FIG. 12 is a perspective view of a separation roller.

As shown in FIGS. 9 and 10, the separation roller 68 rotates via an endless belt 79. The endless belt 79 is suspended between a pulley 73 attached to a hollow rotation shaft 72 and a driving pulley 78 attached to a driving shaft of a motor 74. Moreover, as shown in FIG. 12, the separation roller 68 is provided with suction holes 71 on a surface thereof that are communicated with an external suction device. Here, the separation roller 68 is covered with an elastic body.

The suction holes 71 are formed at positions corresponding to a separation starting end and a separation termination end of the double-faced adhesive tape 3. Two or more holes are formed as suction holes 71 on the separation starting end along an arc of the outer periphery of the tape 3. One long hole is formed as a suction hole 71 on the separation termination end. The shape and number of suction holes 71 may vary depending on the size and shape of the double-faced adhesive tape 3.

As shown in FIGS. 1 and 10, the tape collecting section 13 is provided below the separation roller 68 as a collection box.

The marking section 14 includes a chuck table 75, and a laser device 76. The chuck table 75 suction-holds the wafer 1. The laser device 76 performs marking, such as a two-dimensional code and a three-dimensional solid code, to the wafer 1 suction-held on the chuck table 75.

The wafer delivery section 15 includes a suction pad 77 for suction-holding a rear face of the wafer 1 and the carrier 2. The suction pad 77 slidingly moves from a marking section 14 side toward a delivery position to the third robot arm 16, and moves upward and downward.

The third robot arm 16 of the third wafer transporting mechanism 17 is movable horizontally. Further, the third robot arm 16 is turnable and movable vertically as a whole. The third robot arm 16 has a tip end provided with a U-shaped workpiece holder 16a of a vacuum suction type.

Next, description will be given of a series of operation of the carrier removal device with the wafer transport apparatus with reference to FIGS. 13 to 20.

First, an operation section, not shown, operates for various settings. For instance, setting is made as for a heating temperature of the heater 63 in the carrier removal mechanism 11, and a preliminary cooling temperature and time until the wafer 1 reaches the cooling stage 20 from the holding table 18.

The heating temperature is set in accordance with the double-faced adhesive tape 3 having the adhesion layer 3b with a heat separation property. That is, the temperature is set where the double-faced adhesive tape 3 foams and expands due to heating and loses its adhesion.

For instance, the preliminary cooling temperature is set to a glass transition temperature of resin. Moreover, a cooling time is determined as follows. The shrinkage of the resin 1b and the bear chip 1a is determined in advance that varies in accordance with variations in temperature until the resin 1b heated with the carrier removal mechanism 11 reaches at a glass transition temperature. Here, the shrinkage is determined such that deviation in shrinkage rate of the resin 1b and the bear chip 1a is small and a warp amount of the wafer 1 cooled falls within a given range. In other words, a correlation between the preliminary cooling temperature and the shrinkage of the resin 1b is determined in advance. Then, the correlation is to be set.

When a cooling time is determined, the controller 80 determines a transportation speed of the wafer 1. That is, a distance from the holding table 18 to the cooling stage 20 is determined in advance considering a layout of the apparatus. Accordingly, the transportation speed is determined from the distance and a weight of the wafer 1. Consequently, an inclination angle of the wafer transport apparatus 10 may be determined depending on the transportation speed. The various setting conditions are memorized in a memory 81 provided in the controller 80.

Upon completion of various settings, and the apparatus operates. Firstly, the first robot arm 5 in the first wafer transport mechanism 6 moves toward the cassette C1. The workpiece holder 5a at the tip end of the first robot arm 5 is inserted between the workpieces W housed in the cassette C1. The workpiece holder 5a suction-holds the rear face of the wafer W and transports the wafer W. Then, the workpiece holder 5a reverses the workpiece W upside down. That is, the workpiece W is reversed with a wafer 1 side directed downward, and is moved and placed on the alignment stage 7.

The alignment stage 7 performs alignment on the workpiece W placed thereon based on a notch or an orientation flat formed at an outer periphery thereof. The carrier 2 on the aligned workpiece W is suction-held with the workpiece holder 8a at the tip end of the second robot arm 8, and is transported onto the holding table 18 under this state.

The workpiece W on the holding table 18 is once received on the suction pad 23 projecting from the holding table 18 on the wafer 1 side. Thereafter, the workpiece W is placed on the upper surface of the holding table 18 in a given attitude and position as the suction pad 23 moves downward. Moreover, the outer periphery of the workpiece W is held for alignment by an alignment mechanism provided on an outer periphery of the holding table 18, and then suction-held with the holding table 18. Here, the holding table 18 is heated with the heater 63, and in a standby position slightly below a separation position.

Figure 13:
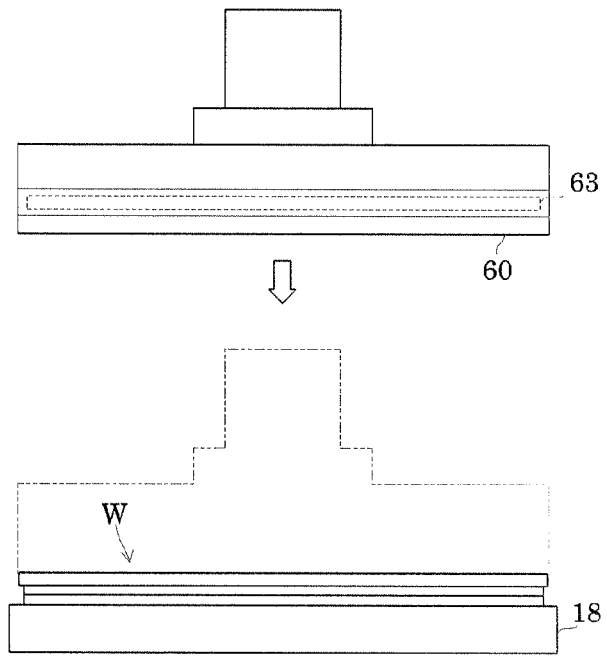
FIGS. 13 and 14 are explanatory views each showing operation of removing the carrier.

Subsequently, as shown in FIG. 13, the suction plate 60 of the workpiece carrier removal mechanism 11 moves downward as to contact the upper surface of the workpiece W to heat the workpiece W with the heater 63 embedded therein. Heating with the suction plate 60 and the heating of the holding table 18 leads to foaming and expansion of the adhesive layer 3b in the double-faced adhesive tape 3 with a heat separation property, whereby the adhesive layer 3b loses its adhesion.

Figure 14:
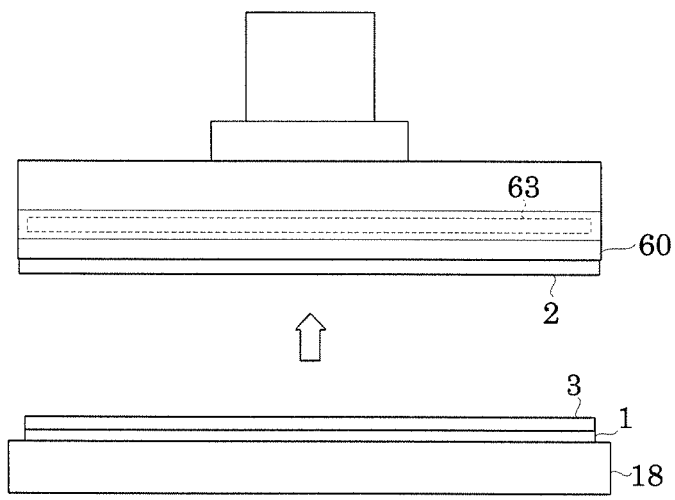

Upon completion of heating for a given time, the suction plate 60 moves upward while the carrier 2 is suction-held, as shown in FIG. 14. Here, the adhesive layer 3b having no adhesion is separated from the lower surface of the carrier 2. Accordingly, only the carrier is moved upward.

Figure 15:
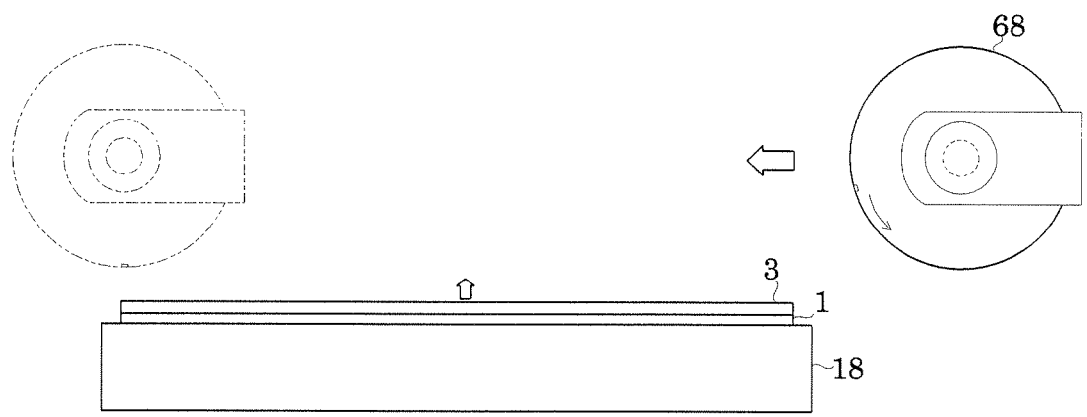
FIGS. 15 to 17 are explanatory views each showing operation of separating a double-faced adhesive tape.

The wafer 1 is held on the holding table 18 from which the carrier is removed. Here, on the wafer 1, the double-faced adhesive tape 3 remains that expands to lose its adhesion and has the exposed adhesive layer 3b with the uneven surface. As shown in FIG. 15, the tape separation mechanism 12 operates under this state to move the separation roller 68 from the standby position to the separation starting position.

Here, the separation roller 68 stops at the separation starting end. Moreover, the separation roller 68 rotates to control the position of the suction holes 71 as to be directed downward for sucking the separation starting end of the double-faced adhesive tape 3.

Figure 16:
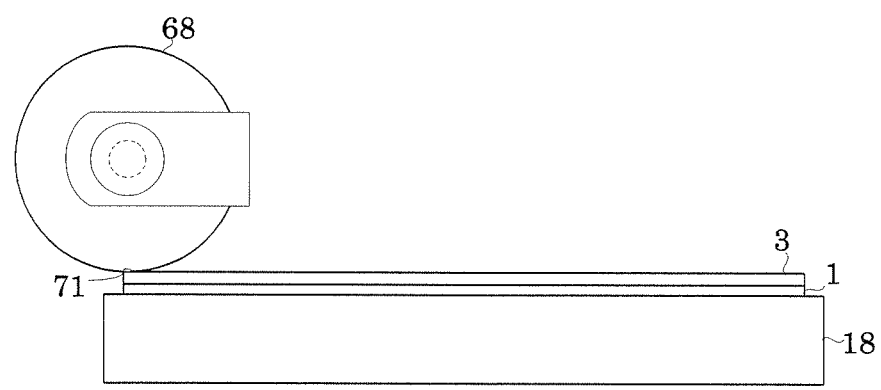
Figure 17:
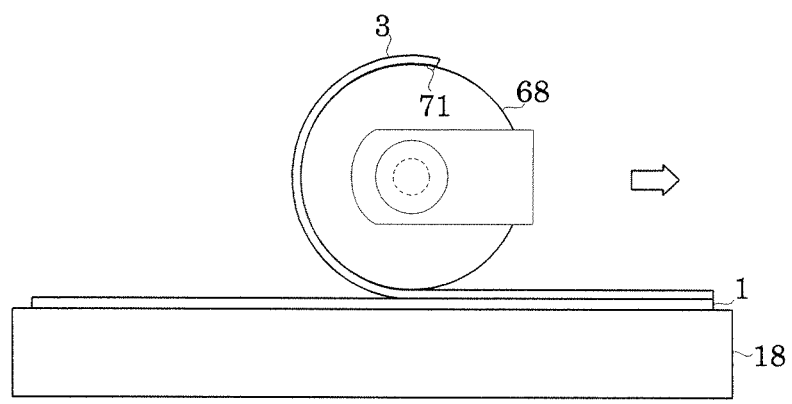

Upon completion of control in position of the separation roller 68 in the separation starting position, as shown in FIG. 16, the cylinder operates to move the holding table 18 upward to appropriately press the double-faced adhesive tape 3 against the separation roller 68. Simultaneously, as shown in FIG. 17, the separation roller 68 moves toward the separation termination end while sucking the double-faced adhesive tape 3, thereby winding up and separates the double-faced adhesive tape 3.

When the separation roller 68 moves across the separation termination end to the standby position, the suction device is switched to positive pressure. Accordingly, air blows out from the suction holes 71 for separating the double-faced adhesive tape 3 from the separation roller 68 and collecting it into the collection box in the tape collecting section 13.

Figure 6:
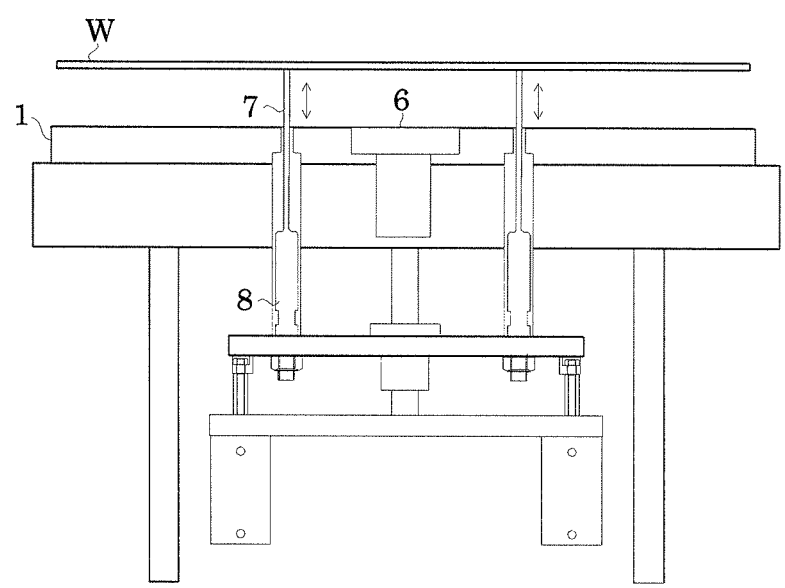
FIG. 6 is an explanatory operation view of a holding table.

Then, the support pins 24 move upward and project from the holding table 18 to push the wafer W upward from the holding table 18, as shown in FIG. 6. Accordingly, the wafer 1 is spaced away from the holding table 18. As shown in FIG. 18, the controller 80 rotates the motor forward to swing the swinging movable table 22 downward at a given swing angle. Moreover, the support pins 24 move downward while the nozzle 26 blows air from a rear side of the wafer 1. Consequently, the wafer 1 floats above the holding table 18, and moves toward the wafer transport path 19 through forward force.

Figure 19:
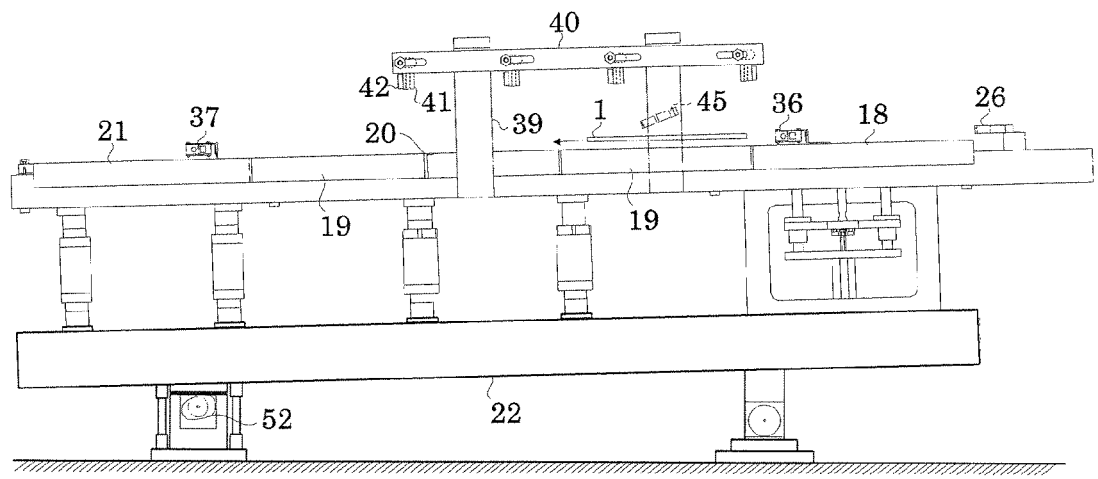

As shown in FIG. 19, a uniform flow rate of air is blown from the holes 29 and 30 of the first and second blow-off sections 27 and 28, respectively, provided on the surface of the wafer transport path 19. The wafer 1 is transported while floating above the wafer transport path toward the cooling stage 20.

The air nozzle 41 blows air from above to preliminarily cool the resin 1b forming the wafer 1 to a glass transition temperature. Here, each temperature sensor 42 provided in the air nozzle 41 detects a surface temperature of the wafer 1. The controller 80 compares an actual detected temperature with a given target temperature. Where no temperature deviation falls within a given range, the temperature is controlled through adjusting at least any of a transportation speed of the wafer 1 and a flow rate and a temperature of air from the air nozzle 41.

Figure 20:
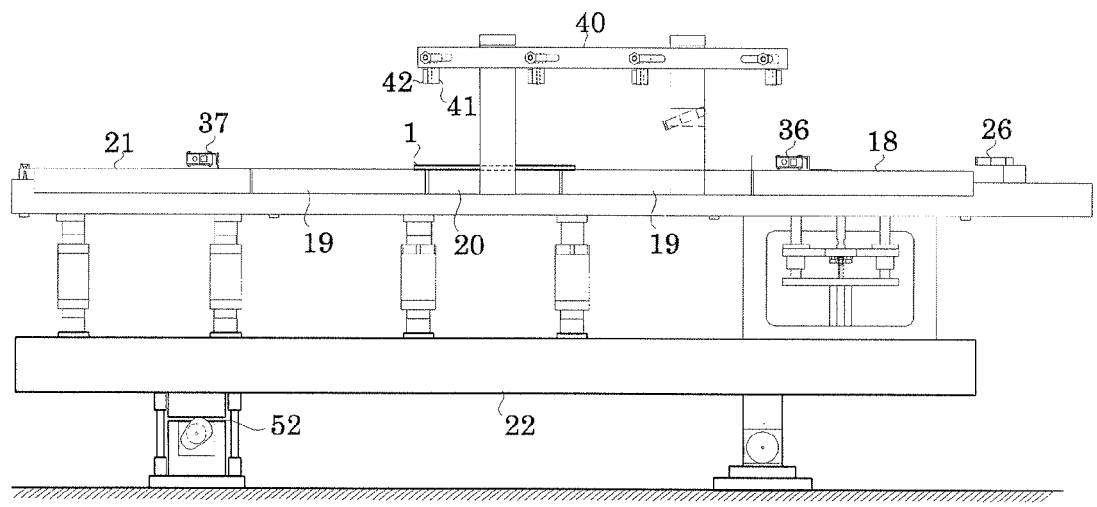

As shown in FIG. 20, the swinging movable table 22 returns to its horizontal attitude through backward rotation of the cam 52 before the wafer 1 reaches on the cooling stage 20. Then, the wafer 1 is placed on the cooling stage 20.

The temperature sensor 43 monitors while cooling the wafer 1 on the cooling stage 20 for a given time until the temperature of the wafer 1 reaches a target temperature (e.g., a room temperature.) As shown in FIG. 19, upon reaching a given temperature of the wafer 1, the cam 52 again rotates forward to swing the swinging movable table 22 downward, and the nozzle 45 blows air from rearward against the wafer 1. Here, the wafer 1 floats due to negative pressure between the holding surface of the cooling stage 20 and the rear face of the wafer 1. Moreover, the wafer 1 with forward force is applied thereto is transported to the transport stage 21 floating above the wafer transport section 19.

The swinging movable table 22 returns to its horizontal attitude through backward rotation of the cam 52 before the wafer 1 reaches on the transport stage 21. Then, the wafer 1 is placed on the transport stage 21. Here, timing of returning the swinging movable board 22 horizontally is determined, for example, in accordance with the result that a sensor, not shown, detects passing of the wafer 1 through a given position or for a given time of period. Herein, the sensor corresponds to the speed detector in this invention.

The wafer 1 on the transport stage 21 is pushed upward and supported via the support pins 46. The second robot arm 8 moves along the wafer transport section 19 to an position appropriately opposite to the transport stage 21. The workpiece holder 8a at the tip of the transport robot arm 8 suction-holds the rear face of the wafer 1, and transports it out of the transport stage 21.

The transported wafer 1 is placed on the chuck table 75 in the marking section 14 for alignment based on a notch, etc. Thereafter, the outer periphery portion out of a circuit formation face of the wafer 1 is marked with laser.

Upon completion of the marking, the wafer 1 is again suction-held with the second robot arm 8, and placed onto the wafer delivery section 15. The wafer 1 is moved to a delivery position of the third robot arm 16 while the suction pad 77 suction-holds the rear face of the wafer 1.

Then, the third robot arm 16 suction-holds the rear face of the wafer 1, and houses it into the cassette C2 with an exposed surface of the bear chip 1a directed upward.

On the other hand, the carrier 2 removed with the carrier removal mechanism 11 is housed into the cassette C2 where the carrier 2 is collected, following transportation of the wafer 1. Here, the carrier 2 need not to be marked. Accordingly, the second robot arm 8 places the carrier 2 from the transport stage 21 onto the wafer delivery section 15.

Thus, a round of operation is completed as mentioned above. The similar operation is to be repeated hereinafter.

According to the foregoing exemplary apparatus, the resin 1b forming the wafer 1 is preliminarily cooled to a glass transition temperature during a transportation process where the wafer 1 from which the carrier 2 is removed through heating is transported from the holding table 18 onto the cooling stage 20. In addition, a preliminary cooling time is set as to minimize deviation in shrinkage of the bear chip 1a and the resin 1b. Consequently, a warp amount of the wafer 1 due to deviation in shrinkage of the bear chip 1a and the resin 1b may be suppressed to a target range set in advance. As a result, there may be avoided reduction in rigidity associated with cracks in the resin 1b or handling errors due to warp of the semiconductor wafer 1.

This invention may be embodied as the following aspects.

(1) In the foregoing exemplary apparatus, the wafer transport section 19 may be a conveyor formed of an endless belt or a roller. In such configuration, it is also preferable that simultaneous cooling may be conducted from the rear face of the wafer 1.

For instance, where a belt conveyor is adopted, the belt conveyor is composed of a material with air permeability, and gas such as air is blown from a nozzle provided on a rear side of the belt.

Moreover, where a roller conveyor is adopted, gas such as air is blown from the nozzle toward a clearance between the rollers arranged at given pitches. Alternatively, the surface of the roller is covered with a permeable elastic body, and the rear face of the wafer 1 is cooled by suction and drawing of outside air from a rotation shaft of the roller. Moreover, the rear face of the wafer 1 is cooled while a coolant is circulated inside of the roller having a controlled temperature. Such configuration may be adopted.

(2) In the foregoing exemplary apparatus, for controlling a preliminary cooling temperature, a flow rate of air may be adjusted individually, or a level of the air nozzle 41 may be controlled. Moreover, an inclination angle of the air nozzle 41 may be adjusted.

Figure 21:
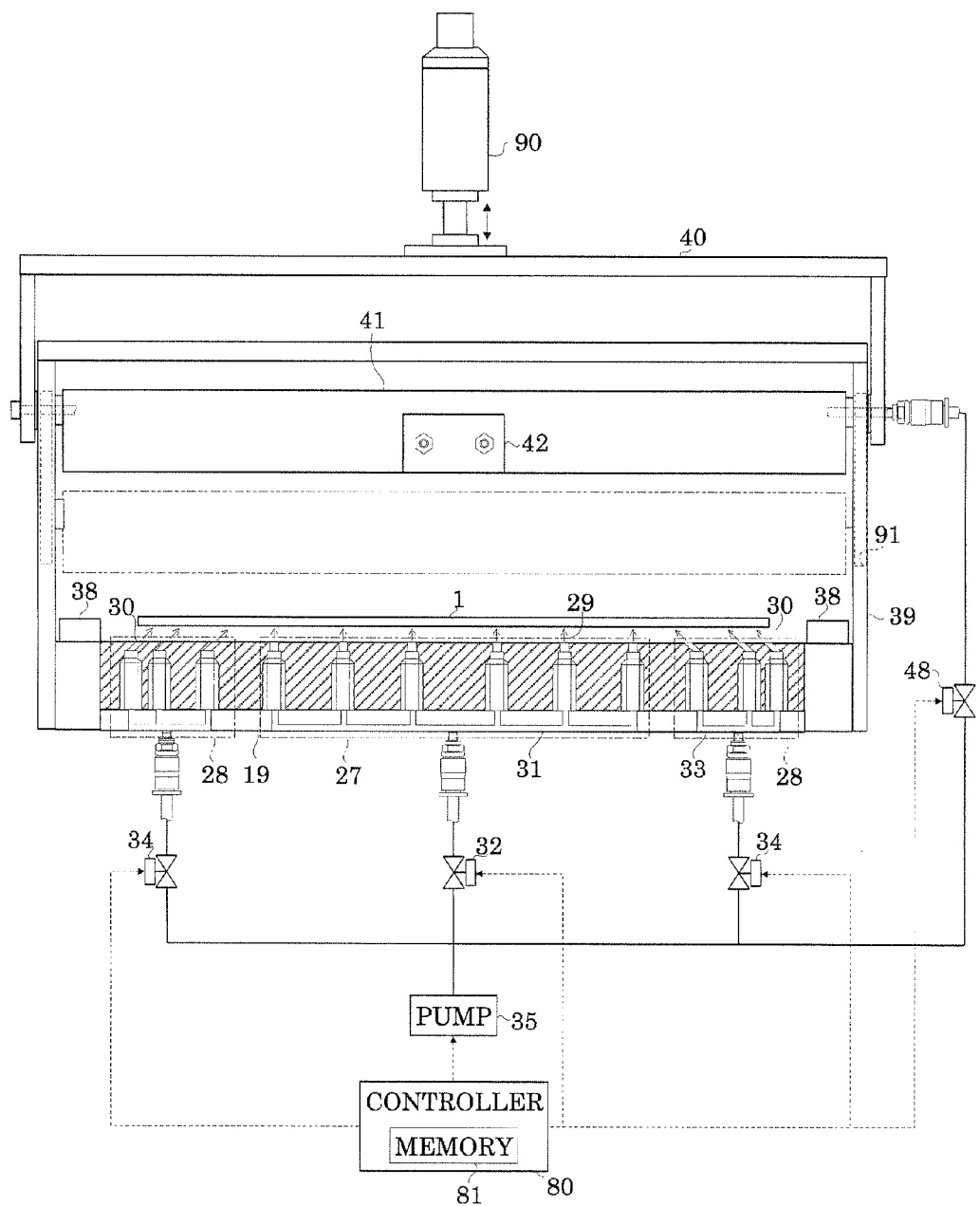
FIG. 21 is a front view of an air nozzle for preliminary cooling according to one modification.

Moreover, for adjusting the level of the air nozzle 41, a linear actuator 90, such as a cylinder, is connected to the frame 40 for moving the frame 40 upward and downward along guide holes 91 provided on the struts 39 in a longitudinal direction, as shown in FIG. 21. Alternatively, the linear actuator 90 may be directly connected to each air nozzle 41.

(3) In the foregoing exemplary embodiment, the temperature sensor may detect a temperature on the rear face of the wafer 1 for controlling a preliminary cooling temperature. That is, deviation in shrinkage rate may be made small by controlling individually a temperature on the exposed surface of the bear chip 1a and that on the surface of the resin surface. Accordingly, warp of the wafer 1 may be suppressed certainly.

(4) In the foregoing exemplary embodiment, a lower portion of the swinging movable table 22 is pivotally supported on a transportation stage 21 side, and an actuator such as a cylinder moves a lower portion of the swinging movable table 22 on a holding table 18 side upward, thereby swinging the swinging movable table 22 downward in the transportation direction. Such configuration may be adopted.

(5) In the foregoing exemplary apparatus, the carrier removal mechanism 11 leaves the double-faced adhesive tape 3 on a wafer 1 side. Alternatively, the double-faced adhesive tape 3 may remain on a carrier 2 side. Herein, an adhesive layer with a heating separation property may be joined on the wafer 1 side.

(6) In the foregoing exemplary apparatus, the wafer 1 is adopted that is diced prior to back grinding and renewed with sorted non-defective bear chips 1a and the resin 1b. Alternatively, the wafer 1 subjected to a back grinding process may be adopted.

That is, the wafer 1 having a back ground rear face is housed into the cassette C1 for supplying the apparatus while the carrier 2 and the wafer 1 are joined together via the double-faced adhesive tape 3 with the adhesive layer 3b of a heating separation property.

(7) In the foregoing exemplary apparatus, the air nozzle 41 may be provided between the cooling stage 20 and the transportation stage 21. Alternatively, Peltier devices may be provided on the transportation stage 21 for cooling.

(8) In the foregoing exemplary apparatus, the double-faced adhesive tape 3 is sucked with the separation roller 68 for separation. Alternatively, the separation tape 3 may be joined for separation.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of transporting a semiconductor wafer covered with a resin or an adhesive tape, comprising the step of:
preliminarily cooling a heated semiconductor wafer during transport to it cooling stage, wherein
when the semiconductor wafer under a heating state at a given temperature is cooled to a target temperature, a correlation between a cooling temperature and shrinkage of the resin or the adhesive tape is determined in advance such that a warp amount of the semiconductor wafer falls within a given range; and
a detector detects a temperature and a transportation speed of the semiconductor wafer in the transport process, and at least any of a temperature and a flow rate of air supplied towards the semiconductor wafer and a transportation speed of the semiconductor wafer is controlled in accordance with detection results.

2. The method if transporting the semiconductor wafer according to claim 1, further comprising the steps of:
preliminarily cooling the heated semiconductor wafer during transport to a first cooling stage;

cooling the semiconductor wafer on the first cooling stage until the resin has a glass transition temperature;

cooling the semiconductor wafer with the resin having the glass transition temperature during transport to a second cooling stage as a transportation position; and cooling the semiconductor wafer on the second cooling stage to a room temperature.

3. The method of transporting the semiconductor wafer according to claim 1, wherein the preliminary cooling step is conducted through blowing air from a nozzle provided above the semiconductor wafer that passes on a transportation path.

4. The method of transporting the semiconductor wafer according to claim 1, wherein the preliminary cooling step is conducted through blowing air from a transportation path toward a rear face of the semiconductor wafer.

5. The method of transporting, the semiconductor wafer according to claim 1, wherein the preliminary cooling step is conducted through blowing air simultaneously from a nozzle provided above the semiconductor wafer that passes on a transportation path and from the transportation path toward the rear face of the semiconductor wafer.

6. A semiconductor wafer transport apparatus for transporting a semiconductor wafer covered with a resin or an adhesive tape, said apparatus comprising:

a wafer transport section for transporting a heated semiconductor wafer;

a preliminary cooling nozzle for blowing air towards the semiconductor wafer transported with the wafer transport section;

a holding stage for mounting and holding the semiconductor wafer preliminarily cooled;

a cooler for cooling the semiconductor wafer on the holding stage;

two or more temperature sensors for detecting a temperature of the semiconductor wafer transported on the wafer transport section and a temperature of the semiconductor wafer on the holding table;

a speed detector for detecting a transportation speed of the semiconductor wafer being transported with the wafer transport section;

a memory for memorizing a correlation between a cooling temperature and shrinkage of the resin or the adhesive tape such that a warp amount of the semiconductor wafer falls within a given range when the semiconductor wafer under a heating state at a given temperature is cooled to reach a target temperature; and a controller for controlling a temperature of the semiconductor wafer through detecting the temperature and the transport speed of the semiconductor wafer transported with the wafer transport section by the temperature sensors and the speed detector, and selecting a condition for changing setting of at least any of a temperature and a flow rate of air supplied toward the semiconductor wafer and a transport speed of the semiconductor wafer in accordance with detection results.

7. The apparatus for transporting the semiconductor wafer according to claim 6, wherein the holding stage includes a first holding stage provided with the cooler for cooling the resin to a glass transition temperature, and a second holding stage provided with the cooler for cooling the semiconductor wafer to a room temperature; and the wafer transport sections are arranged on an upper stream of the first holding stage and between the first and the second holding stage.

8. A semiconductor wafer transport apparatus for transporting a semiconductor wafer covered with a resin or an adhesive tape, said apparatus comprising;

a wafer transport section for transporting a heated semiconductor wafer;

a preliminary cooling nozzle for blowing air towards the semiconductor wafer transported with the wafer transport section:

a holding stage for mounting and holding the semiconductor wafer preliminarily cooled; and a cooler for cooling the semiconductor wafer on the holding stage, wherein the wafer transport section includes a first blow-off section and a second blow-off section on a transport surface thereof, the first blow-off section at a center portion of the wafer transport section blows air vertically against a rear face of the semiconductor wafer along a transport direction of the semiconductor wafer, the second blow-off section blows air obliquely against the rear face of the semiconductor wafer m a semiconductor wafer width direction, in which the wafer transport section has a given clearance in the semiconductor wafer width direction for transporting while floating the semiconductor wafer on the transport surface larger than the semiconductor wafer, and the wafer transport section controls travel and cooling of the semiconductor wafer through adjusting a flow rate of air supplied from the preliminary cooling nozzle, the first blow-off section, and the second blow-off section.

* * * * *